(12) United States Patent
Jeong et al.

(10) Patent No.: US 7,867,834 B2
(45) Date of Patent: Jan. 11, 2011

(54) MANUFACTURING METHOD OF SEMICONDUCTOR DEVICE CAPABLE OF FORMING THE LINE WIDTH OF A GATE

(75) Inventors: Eun Soo Jeong, Eumseong-gun (KR); Jea Hee Kim, Yeoju-gun (KR)

(73) Assignee: Dongbu Hitek Co., Ltd., Seoul (KR)

( * ) Notice: Subject to any disclaimer, the term of this patent is extended or adjusted under 35 U.S.C. 154(b) by 155 days.

(21) Appl. No.: 11/779,748

(22) Filed: Jul. 18, 2007

(65) Prior Publication Data

US 2008/0020543 A1    Jan. 24, 2008

(30) Foreign Application Priority Data

Jul. 18, 2006    (KR) ...................... 10-2006-0066836

(51) Int. Cl.
*H01L 21/336* (2006.01)
*H01L 21/8234* (2006.01)

(52) U.S. Cl. .................. 438/197; 438/424; 438/425; 438/427; 438/700; 257/E21.54

(58) Field of Classification Search ................ 438/197, 438/242, 700, 424–427; 257/E21.54
See application file for complete search history.

(56) References Cited

U.S. PATENT DOCUMENTS

| | | | | |
|---|---|---|---|---|
| 6,281,082 B1* | 8/2001 | Chen et al. | .................. | 438/296 |
| 6,753,229 B1* | 6/2004 | King et al. | .................. | 438/287 |
| 6,825,124 B2* | 11/2004 | Kim | .......................... | 438/700 |
| 6,878,588 B2* | 4/2005 | Dong et al. | .................. | 438/257 |
| 7,663,195 B2* | 2/2010 | Ohmi et al. | .................. | 257/409 |
| 2002/0127809 A1* | 9/2002 | Park et al. | .................... | 438/296 |
| 2003/0119257 A1* | 6/2003 | Dong et al. | ................. | 438/257 |
| 2003/0153136 A1* | 8/2003 | Matsumoto et al. | ......... | 438/151 |
| 2005/0074938 A1* | 4/2005 | Han | .......................... | 438/258 |
| 2005/0285194 A1* | 12/2005 | Lee et al. | ..................... | 257/347 |
| 2006/0141727 A1* | 6/2006 | Shin | .......................... | 438/302 |
| 2006/0145243 A1* | 7/2006 | Wong et al. | ................. | 257/316 |
| 2006/0148230 A1* | 7/2006 | Kim | .......................... | 438/595 |
| 2007/0155075 A1* | 7/2007 | Kim et al. | ..................... | 438/197 |

\* cited by examiner

*Primary Examiner*—Thanh V Pham
*Assistant Examiner*—Duy T Nguyen
(74) *Attorney, Agent, or Firm*—Saliwanchik, Lloyd & Saliwanchik

(57) ABSTRACT

A manufacturing method of a semiconductor device according to an embodiment includes: forming a trench for a device isolation area and a semiconductor projection with a first width by etching a semiconductor substrate; forming an oxide film on the trench and the semiconductor projections; forming an insulating layer on the oxide film; exposing the upper surface of the semiconductor projection by polishing the insulating layer and the oxide film; forming a gate insulating layer at a lower region of the semiconductor projection; and etching the insulating layer and the oxide film on the substrate.

13 Claims, 5 Drawing Sheets

MANUFACTURING METHOD OF SEMICONDUCTOR DEVICE CAPABLE OF FORMING THE LINE WIDTH OF A GATE

CROSS-REFERENCE TO RELATED APPLICATION

The present application claims the benefit under 35 U.S.C. §119 of Korean Patent Application No. 10-2006-0066836, filed Jul. 18, 2006, which is hereby incorporated by reference in its entirety.

BACKGROUND

The fineness of features of a semiconductor device has progressed according to a high integration of the semiconductor device. This fineness of features of the semiconductor device requires the finesses of wirings as well as gates.

However, a photo lithography process performed by means of light sources such as ArF, KrF, F2, etc. and the patterning of a photoresist has a limitation for the implementation of the fine pattern of the gate.

This is due to the limitation of an optical system and the limitation the resolution of a photoresist polymer itself.

BRIEF SUMMARY

Embodiments of the present invention relate to a manufacturing method of a semiconductor device, and in particular, relate to a manufacturing method of a semiconductor device capable of finely forming the line width of a gate.

According to an embodiment a manufacturing method of a semiconductor device having a gate structure of a fine line width is provided by using a photolithography process and an oxidation process.

The manufacturing method of the semiconductor device according to an embodiment comprises: etching a semiconductor substrate to form a trench for forming a device isolation area and a semiconductor projection with a first width; forming an oxide film on the substrate including on the trench and the semiconductor projection; forming an insulating layer on the oxide film; exposing the upper surface of the semiconductor projection by polishing the insulating layer and the oxide film; forming a gate insulating layer at a lower portion of the semiconductor projection; and removing the insulating layer and the oxide film.

BRIEF DESCRIPTION OF THE DRAWINGS

FIG. 2 is a cross-sectional view after a first photoresist pattern is formed according to an embodiment.

FIG. 3 is a cross-sectional view after a semiconductor projection is formed according to an embodiment.

FIG. 4 is a cross-sectional view after a second photoresist pattern is formed according to an embodiment.

FIG. 5 is a cross-sectional view after an oxide film is formed according to an embodiment.

FIG. 6 is a cross-sectional view after an insulating layer is formed according to an embodiment.

FIG. 7 is a cross-sectional view after a planarization process is performed according to an embodiment.

FIG. 8 is a cross-sectional view after a gate insulating layer is formed according to an embodiment.

FIG. 9 is a cross-sectional view after the gate insulating layer is formed and the semiconductor projection is removed according to an embodiment.

FIG. 10 is a cross-sectional view after a polysilicon is deposited on a trench according to an embodiment.

DETAILED DESCRIPTION OF THE EMBODIMENTS

A manufacturing method of a semiconductor device according to embodiments of the present invention will be described with reference to accompanying drawings.

For reference, where a part such as a layer, film, area, plate, etc. is described to be "on" another part, the part can be "directly on" the other part or other parts can be formed therebetween. In addition, where a part is described to be "directly on" another part, it means that no other part is formed therebetween.

Figure 1:
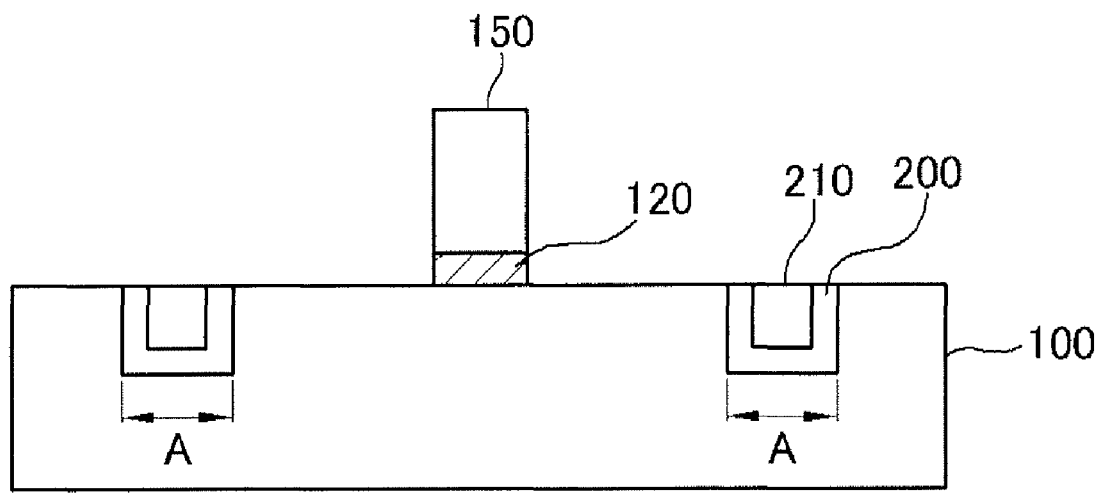
FIG. 1 is a cross-sectional view showing a semiconductor device according to an embodiment of the present invention.

Referring to the FIG. 1, a semiconductor device according to an embodiment can include a ridge-type gate 150 formed on a semiconductor substrate 100, having a gate insulating layer 120 formed between the gate 150 and the semiconductor substrate 100. The semiconductor substrate 100 can be provided with device isolation areas (A) defining an active area. These device isolation areas (A) can be provided with an oxide film 200 formed inside of a trench and an insulating layer 210 burying the trench on the oxide film 200.

At this time, the semiconductor substrate 100 can be formed of amorphous silicon, and the gate 150 can include polysilicon.

Hereinafter, a manufacturing method of the semiconductor device according to a first embodiment will be described with reference to FIGS. 2 to 8.

Figure 2:
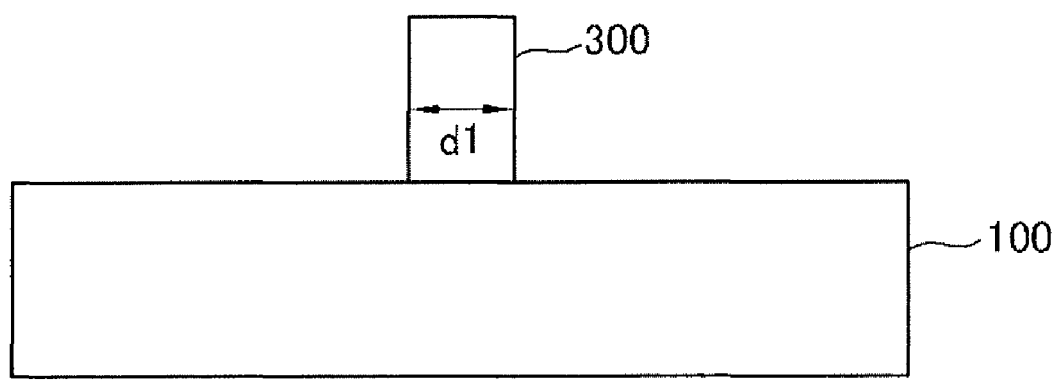
FIGS. 2-8 illustrate a manufacturing method of a semiconductor device according to an embodiment of the present invention.

As shown in FIG. 2, a photoresist pattern 300 with a first width (d1) is formed on the semiconductor substrate 100. At this time, the first width (d1) can be a minimum line width capable of being implemented by means of a photolithography process, and is determined by considering the width of wiring intended to be finally formed.

Figure 3:
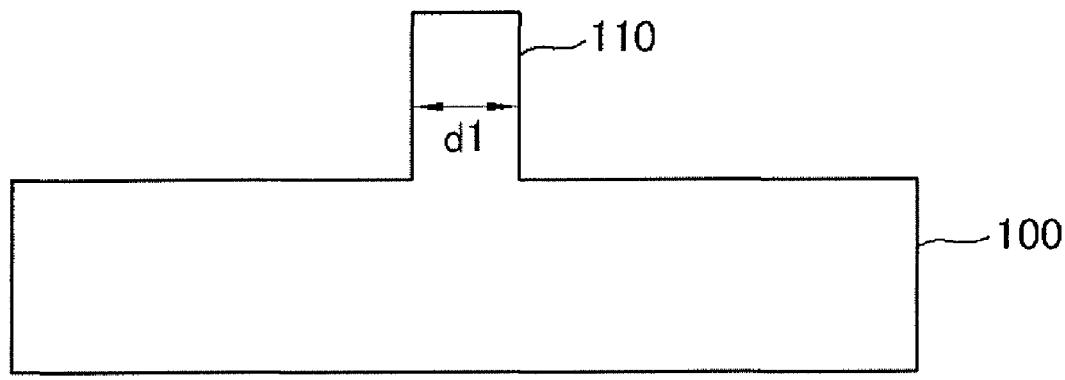

Referring to FIG. 3, the semiconductor substrate 100 can be etched using the first photoresist pattern 300 as a mask to form a semiconductor projection 110 on the substrate 100.

The semiconductor projection 110 has a ridge shape, and has a first width (d1) like the first photoresist pattern 300. Thereafter, the first photoresist pattern 300 is removed.

In one embodiment, after the first photoresist pattern 300 is removed, a negative photoresist can be applied over the semiconductor substrate 100 and light can be selectively irradiated to the device isolation area (A) by using a photo mask.

Figure 4:
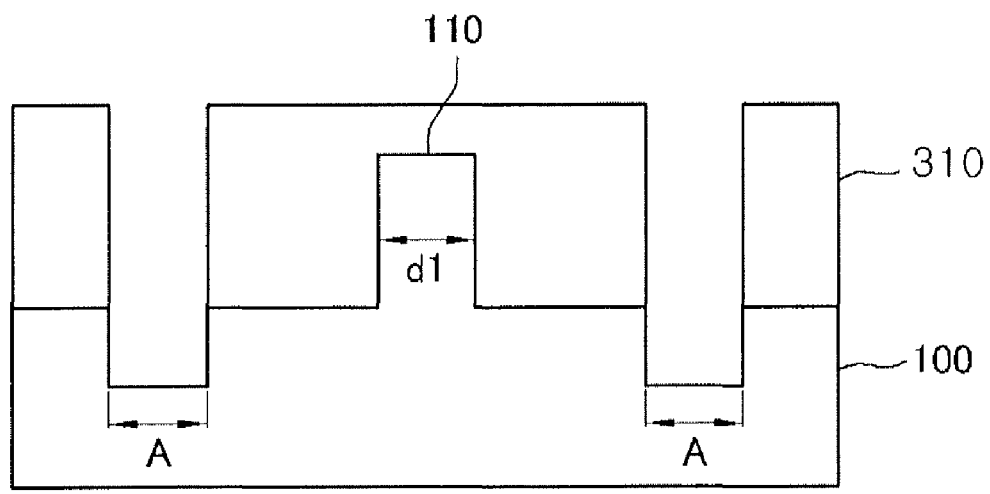

Referring to FIG. 4, a second photoresist pattern 310 exposing the device isolation area (A) can be formed by developing the photoresist to which the light is selectively irradiated.

If the second photoresist pattern 310 is formed, an etching process such as reactive ion etching (RIE) or deep reactive ion etching (DRIE) can be performed by using the second photoresist pattern as a mask.

Accordingly, a trench as shown in FIG. 4 is formed in the device isolation area (A). After the trench is formed, the remaining second photoresist pattern 310 is removed.

Figure 5:
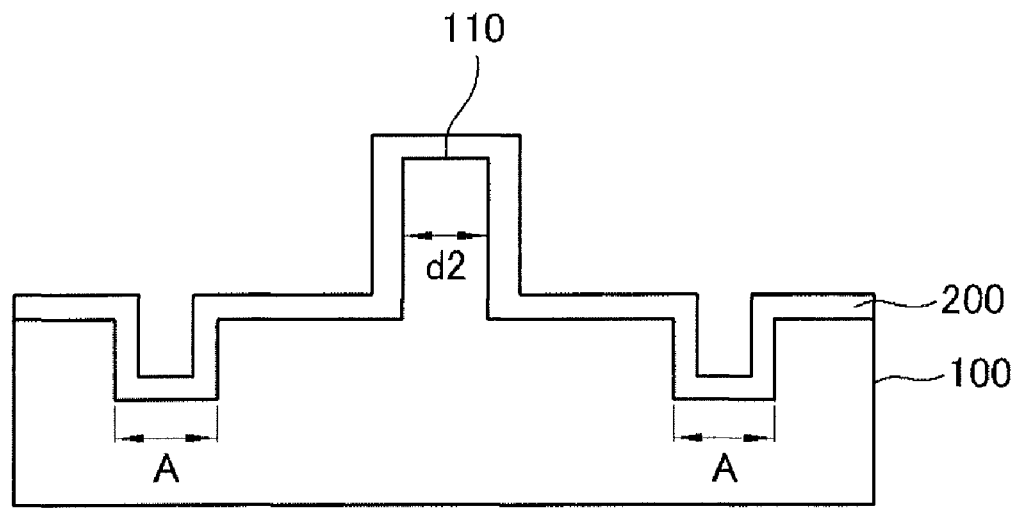

Next, referring to FIG. 5, an oxide film 200 can be formed over the semiconductor substrate 100.

The oxide film 200 can be formed by performing wet oxidation of the semiconductor substrate 100. In an embodiment, the wet oxidation is performed at a high temperature of 900° C. to 1100° C. for a short time and using steam ($H_2O$).

Forty to fifty percent of the thickness of the oxide film 200 generated through this wet oxidation is formed penetrating into the inside of the semiconductor substrate 100, and a remaining portion is formed outside the semiconductor substrate 100.

Accordingly, the semiconductor projection 110 becomes a second width (d2), which is narrower than the first width (d1), due to the generation of this oxide film 200.

Figure 6:
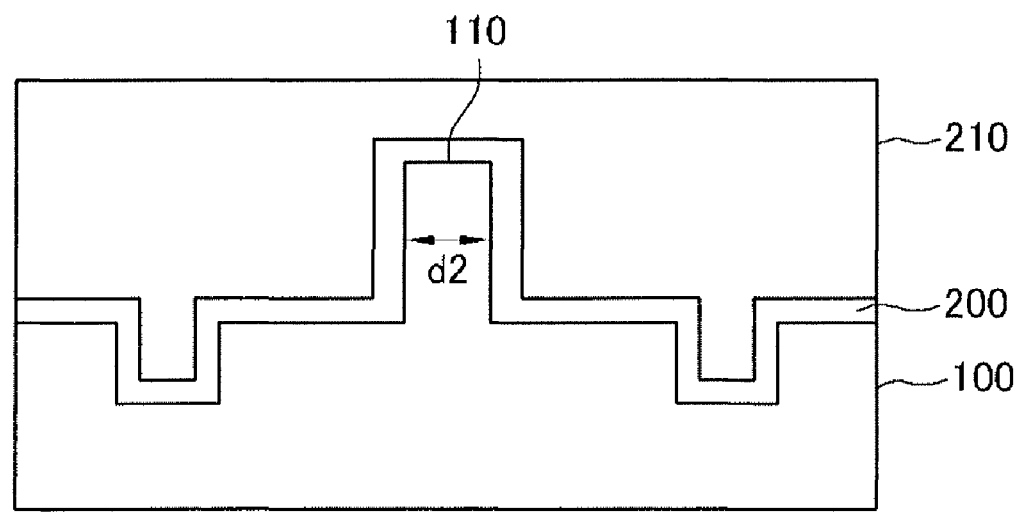

Thereafter, referring to FIG. 6, an insulating layer 210 can be formed on the oxide film 200 to cover the semiconductor projection 110. The insulating layer 210 can be made of, for example, TEOS, and buries the inside of the trench in the device isolation area (A).

Figure 7:
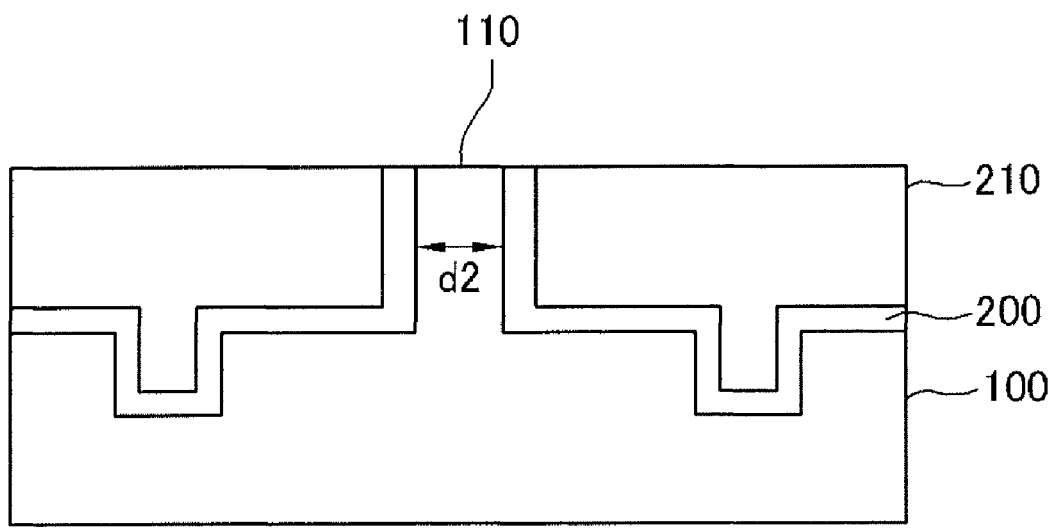

Referring to FIG. 7, the insulating layer 210 and the oxide film 200 can be polished and planarized until the upper surface of the semiconductor projection 110 is exposed. The polishing process can be performed by means of a chemical mechanical polishing scheme.

Figure 8:
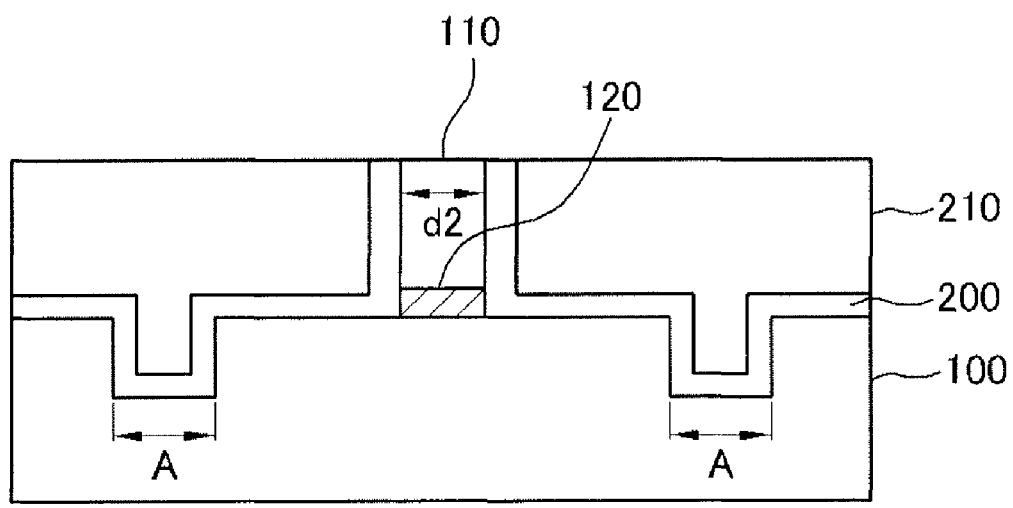

Next, referring to FIG. 8, oxygen ions (O+) are implanted through the upper surface of the exposed semiconductor projection 110. The gate insulating layer 120 can be formed at the interface between the semiconductor projection 110 and the substrate 100 by the implanting of the oxygen ions (O+).

Thereafter, the insulating layer 210 and the oxide film 200 are etched until the semiconductor substrate 100 is exposed, so that the semiconductor projection 110 with the second width (d2) is exposed.

Accordingly, the gate 150 as shown in FIG. 1 is completed. In addition, the trench in the device isolation area (A) filled with the insulating layer 210 that defines the active area is completed.

In a further embodiment, the contact resistance of the gate 150 can be reduced by forming silicide (not shown) by means of a full silicide (FUSI) process.

As described above, the gate 150 of the semiconductor device is formed to be smaller than the width of the first photoresist pattern 300 defining the semiconductor projection 110. In addition, the gate 150 and the device isolation area (A) can be formed together, thereby making it possible to simplify the process.

Hereinafter, a manufacturing method of a semiconductor device according to a second embodiment will be described with reference to FIGS. 9 and 10.

The manufacturing method of the semiconductor device according to the second embodiment can include the same processes as described with respect to the first embodiment up to the process that the gate insulating layer 120 is formed at the interface between the semiconductor projection 110 and the substrate 100 by implanting the oxygen ions (O+).

Thus, illustration and description of the second embodiment for the same processes as the first embodiment will be omitted.

Figure 9:
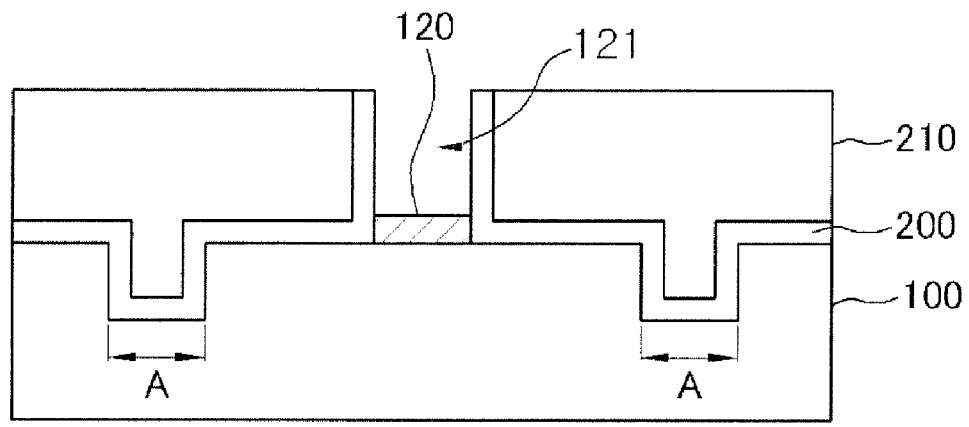
FIGS. 9 and 10 illustrate a manufacturing method of a semiconductor device according to another embodiment of the present invention.

Referring to FIG. 9, after the gate insulating layer 120 is formed as described with respect to FIG. 8, the semiconductor projection 110 on the gate insulating layer 120 can be removed.

In one embodiment, the semiconductor projection 110 on the gate insulating layer 120 can be removed by selectively wet-etching only the semiconductor projection 110, which is silicon, using fluorinated ethylene propylene (FEP).

Accordingly, a trench 121 is formed having a bottom surface of the exposed gate insulating layer 120 and sides surrounded by the oxide film 200. The trench 121 has a second width (d2) narrower than the first width (d1).

Figure 10:
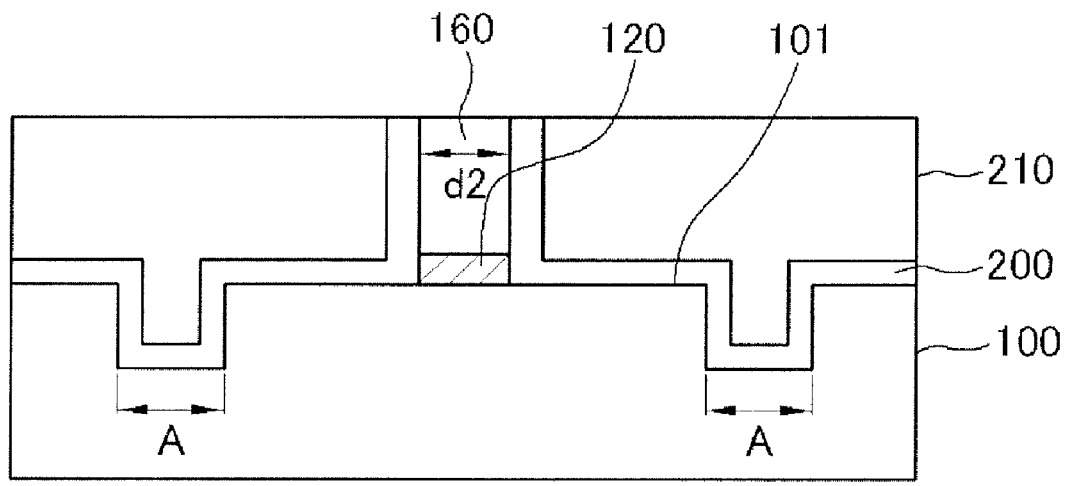

After the trench 121 is formed, referring to FIG. 10, polysilicon can be deposited to fill the trench 121. In an embodiment, polysilicon can be deposited and then planarized until the insulating layer 210 is exposed.

Thereafter, the insulating layer 210 and the oxide film 200 can be etched until the surface 101 of the semiconductor substrate 100 is exposed, so that the polysilicon gate 160 with the second width (d2) is exposed.

Accordingly, the polysilicon gate 160 having the form of the structure in FIG. 1 is completed.

As such, with the manufacturing method of the semiconductor device according to embodiments, the widths of the gates 150 and 160 can be finely implemented by using a photolithography process and an oxide film formation process together.

In addition, since it is not required to newly fabricate the photo mask for implementing the fine line width, manufacturing cost can be reduced, and since the gates 150 and 160 and the device isolation area (A) can be formed together, the process can be simplified. Thus, the cost and time of the process can be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A manufacturing method of a semiconductor device comprising:

etching a semiconductor substrate to form a first trench and a semiconductor projection having a first width, wherein the semiconductor projection is made from the semiconductor substrate, wherein the semiconductor projection is formed by etching the semiconductor substrate to a first depth, and wherein a second trench for a device isolation area is formed after forming the semiconductor projection by etching in a region of the semiconductor substrate spaced apart from the bottom of the semiconductor projection;

forming a conformal oxide film on the substrate, including on the second trench and the semiconductor projection;

forming an insulating layer on the oxide film;

exposing an upper surface of the semiconductor projection by polishing the insulating layer and the oxide film;

forming a gate insulating layer at a lower region of the semiconductor projection; and etching the insulating layer and the oxide film to expose a bottom of the first trench between the second trench and the semiconductor projection.

2. The method according to claim 1, wherein etching the semiconductor substrate comprises:
forming a first photoresist pattern with the first width on the substrate;
forming the semiconductor projection by etching the substrate using the first photoresist pattern as a mask;
forming a second photoresist pattern exposing a portion of the substrate where the device isolation area is to be formed on the substrate; and
forming the second trench by etching the substrate using the second photoresist pattern as a mask.

3. The method according to claim 2, further comprising:
removing the first photoresist pattern after forming the semiconductor projection; and
removing the second photoresist pattern after forming the second trench.

4. The method according to claim 2, wherein forming the second trench by etching the substrate comprises performing a reactive ion etching process.

5. The method according to claim 1, wherein forming the conformal oxide film comprises performing a wet oxidation of the surface of the semiconductor substrate.

6. The method according to claim 5, wherein the wet oxidation is performed at a high temperature of 900° C. to 1100° C. for a short time using steam.

7. The method according to claim 1, wherein upon forming the oxide film, forty to fifty percent of the thickness of the oxide film is formed from the semiconductor projection and a remaining thickness is formed outside the semiconductor projection, whereby the semiconductor projection has a second width narrower than the first width.

8. The method according to claim 1, wherein forming the insulating layer comprises forming the insulating layer to bury the second trench and cover the semiconductor projection.

9. The method according to claim 1, wherein exposing the upper surface of the semiconductor projection comprises performing a chemical mechanical process.

10. The method according to claim 1, wherein forming the gate insulating layer comprises implanting oxygen ions through the upper surface of the exposed semiconductor projection using the planarized insulating layer as a mask.

11. The method according to claim 1, further comprising:
removing the exposed semiconductor projection to expose the gate insulating layer within a trench; and
depositing a crystalline semiconductor on the trench.

12. The method according to claim 11, wherein the crystalline semiconductor comprises polysilicon.

13. The method according to claim 11, wherein removing the exposed semiconductor projection comprises selectively wet-etching the semiconductor projection by using fluorinated ethylene propylene (FEP).

* * * * *